United States Patent
Kiefer et al.

(10) Patent No.: US 10,768,256 B2
(45) Date of Patent: Sep. 8, 2020

(54) METHOD, PROCESSOR AND MAGNETIC RESONANCE APPARATUS FOR DISPLAYING QUANTITATIVE MAGNETIC RESONANCE IMAGE DATA

(71) Applicant: Siemens Healthcare GmbH, Erlangen (DE)

(72) Inventors: Berthold Kiefer, Erlangen (DE); Lars Lauer, Neunkirchen (DE); Heiko Meyer, Uttenreuth (DE); Edgar Mueller, Heroldsbach (DE); Elmar Rummert, Erlangen (DE); David Grodzki, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 561 days.

(21) Appl. No.: 15/582,054

(22) Filed: Apr. 28, 2017

(65) Prior Publication Data

US 2017/0315200 A1    Nov. 2, 2017

(30) Foreign Application Priority Data

Apr. 28, 2016    (DE) .......................... 10 2016 207 314

(51) Int. Cl.
*G01R 33/56*    (2006.01)
*G01R 33/48*    (2006.01)
(Continued)

(52) U.S. Cl.
CPC ..... *G01R 33/5608* (2013.01); *G01R 33/4828* (2013.01); *G01R 33/5659* (2013.01);
(Continued)

(58) Field of Classification Search
USPC .......................... 324/300–322; 600/407–435
See application file for complete search history.

(56) References Cited

U.S. PATENT DOCUMENTS

| | | | |
|---|---|---|---|
| 6,823,205 B1* | 11/2004 | Jara ........................ | G01R 33/50 324/307 |
| 2011/0260727 A1* | 10/2011 | Punchard ........... | G01R 33/3875 324/318 |

(Continued)

OTHER PUBLICATIONS

Bottomley et al., "A review of normal tissue hydrogen NMR relaxation times and relaxation mechanisms from 1-100 MHz: Dependence on tissue type, NMR frequency, temperature, species, excision, and age," Medical Physics, vol. 11, No. 4, pp. 425-448 (1984).

(Continued)

*Primary Examiner* — Farhana A Hoque
(74) *Attorney, Agent, or Firm* — Schiff Hardin LLP

(57) ABSTRACT

In a method for displaying quantitative magnetic resonance image data, and a processor, and a magnetic resonance (MR) apparatus that implement such a method, first quantitative MR image data of an examination object are provided to the processor, the first quantitative MR image having been obtained using an MR scanner with a first basic magnetic field strength. The first quantitative magnetic resonance image data are converted in the processor from the first basic magnetic field strength to a second basic magnetic field strength, thereby generating second quantitative MR image data, which are then displayed.

17 Claims, 2 Drawing Sheets

(51) Int. Cl.
*G01R 33/565* (2006.01)
*G06T 11/20* (2006.01)
(52) U.S. Cl.
CPC . *G01R 33/56518* (2013.01); *G01R 33/56563* (2013.01); *G06T 11/20* (2013.01)

(56) References Cited

U.S. PATENT DOCUMENTS

2016/0310761 A1 10/2016 Li et al.
2016/0349342 A1 12/2016 Cohen
2017/0315200 A1* 11/2017 Kiefer ................ G01R 33/4828

OTHER PUBLICATIONS

Ma et al., "Magnetic Resonance Fingerprinting," Nature, vol. 495, No. 7440, pp. 187-192 (2013).
Buonincontri et al., "MR Fingerprinting with Simultaneous B1 Estimation," Magnetic Resonance in Medicine, vol. 76, pp. 1127-1135 (2016).
Ortendahl et al., "Analytical Tools for Magnetic Resonance Imaging," Radiology, vol. 153, pp. 479-488 (1984).
Chinese Action dated Feb. 28, 2020, for Application No. 201710288637.9, and English translation.

* cited by examiner

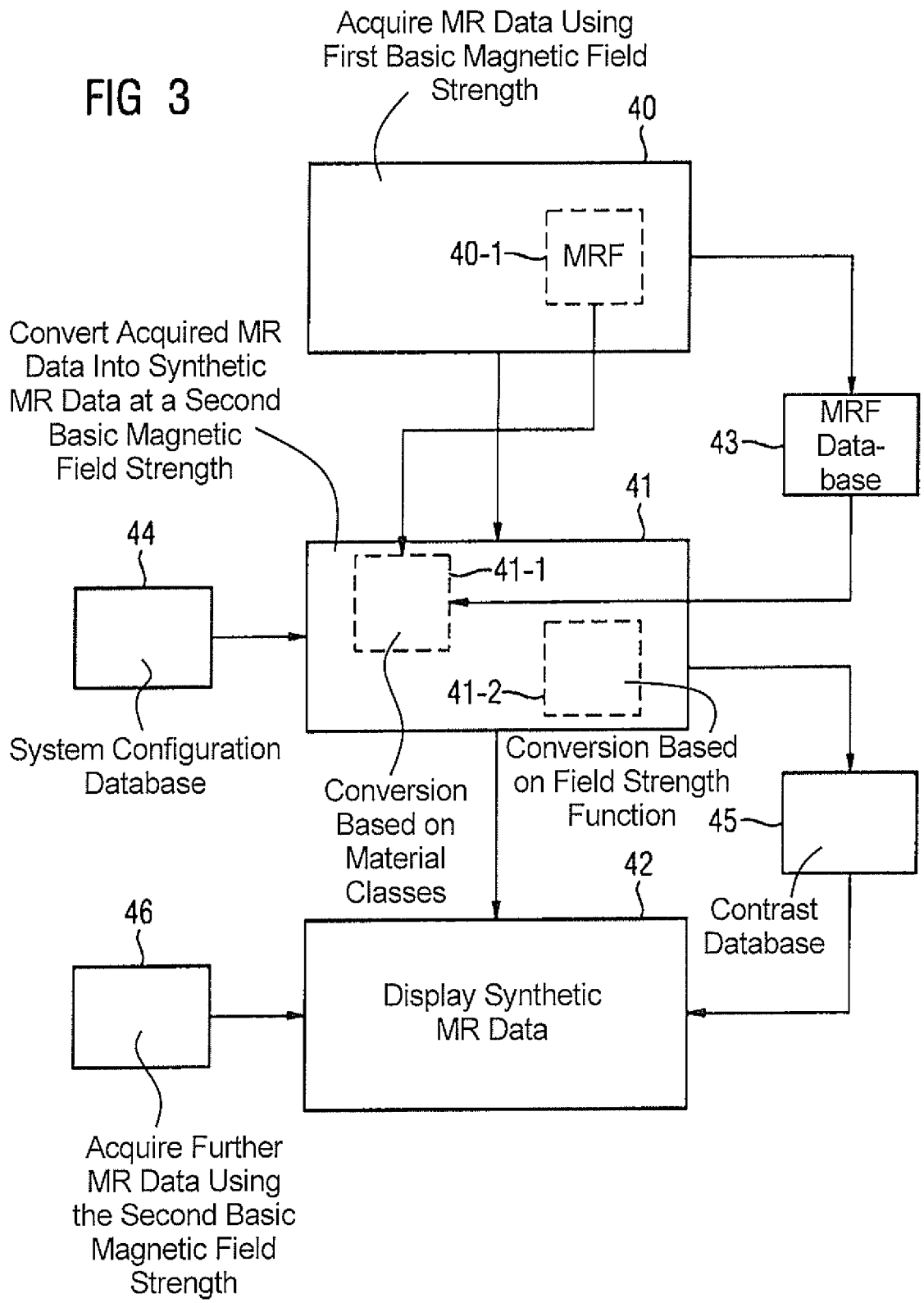

METHOD, PROCESSOR AND MAGNETIC RESONANCE APPARATUS FOR DISPLAYING QUANTITATIVE MAGNETIC RESONANCE IMAGE DATA

BACKGROUND OF THE INVENTION

Field of the Invention

The invention concerns a method for displaying quantitative magnetic resonance image data, as well as a processor, a magnetic resonance apparatus, and a non-transitory, computer-readable data storage medium that implements such a method.

Description of the Prior Art

In a magnetic resonance apparatus, also called a magnetic resonance imaging system, usually an object undergoing investigation, for example a patient, a healthy test person, an animal or a phantom, is exposed to a relatively strong basic magnetic field, for example of 1.5 or 3 or 7 tesla, by operation of a basic field magnet. In addition, a gradient coil arrangement is used to apply gradient switching. Suitable RF antennas are then used to emit radio-frequency pulses, for example excitation pulses, and this results in nuclear spins of certain atoms being excited to resonance by being tipped by a defined flip angle in relation to the magnetic field lines of the basic magnetic field. During relaxation of the excited nuclear spins, radio-frequency signals, —called magnetic resonance signals, are emitted and these are received using suitable radio-frequency antennas, and then undergo further processing. Finally, the desired image data can be reconstructed from the raw data that are acquired in this way.

Thus, for a particular measurement it is necessary to emit a particular magnetic resonance sequence, also called a pulse sequence, that contains a series of radio-frequency pulses, for example excitation pulses and refocusing pulses, and gradient switching in a manner coordinated therewith, on different gradient axes in different spatial directions. Readout windows are defined in relation to time that predetermine the periods during which the induced magnetic resonance signals are acquired.

Quantitative magnetic resonance methods that can be used to quantify material properties of tissue of the object undergoing investigation, such as a T1 relaxation time or a T2 relaxation time, are known. Quantitative magnetic resonance methods of this kind can be used to acquire quantitative magnetic resonance image data and display such data to a user.

SUMMARY OF THE INVENTION

An object of the invention is to improve the display of quantitative magnetic resonance image data.

The method according to the invention for displaying quantitative magnetic resonance image data of an object undergoing investigation includes the following method steps.

First quantitative magnetic resonance (MR) image data of the object undergoing investigation are provided to a processor, the first MR image data having been acquired by an MR data acquisition scanner with its basic field magnet operated at a first basic magnetic field strength.

The first quantitative MR image data are converted in the processor from the data acquired with the first basic magnetic field strength into data as would be acquired with a second basic magnetic field strength that differs from the first, whereby second quantitative magnetic resonance image data are generated.

The second quantitative magnetic resonance image data are displayed on a display screen in communication with the processor.

The providing of the first quantitative magnetic resonance image data may be acquiring the first quantitative magnetic resonance image data by operating the scanner, or may be loading already-acquired first quantitative magnetic resonance image data into the processor from a database. Acquiring the first quantitative magnetic resonance image data is (or was) performed using a quantitative magnetic resonance method. The acquisition of the first quantitative magnetic resonance image data is performed using a magnetic resonance scanner that has a superconducting magnet or a permanent magnet with the first basic magnetic field strength. The basic magnetic field, which has the first basic magnetic field strength, is static and is designed to align nuclear spins in the body of the object undergoing investigation in the parallel or anti-parallel direction to the basic magnetic field.

The quantitative magnetic resonance method that is used to acquire the first quantitative magnetic resonance image data serves to determine at least one material parameter. The at least one material parameter is quantified with spatial resolution. Thus, the first quantitative magnetic resonance image data includes a spatially resolved distribution of the at least one material parameter. The at least one material parameter preferably characterizes a physical property of the material, for example the tissue, from which the magnetic resonance signals are acquired. In particular, the at least one material parameter may quantify a reaction of the material to radio-frequency excitation. A selection of relevant material parameters that are present in the first quantitative magnetic resonance image data includes a T1 relaxation time, a T2 relaxation time, a diffusion value (for example an apparent diffusion coefficient, ADC), a magnetization moment, a proton density, a resonant frequency, a concentration of a material, etc. Other material parameters deemed useful by those skilled in the art are also conceivable. Any desired combination of these material parameters may be determined in the quantitative magnetic resonance method. The first quantitative magnetic resonance image data may thus advantageously contain information about absolute physical variables. Thus, advantageously a voxel value of the first quantitative magnetic resonance image data has a direct relationship with a physical measured value and may in particular have a physical unit. The quantitative magnetic resonance method that is used for acquiring the first quantitative magnetic resonance image data may be a conventional method, such as a T1 mapping method or a magnetic resonance fingerprinting method, which will be described in more detail below.

Conversion of the first quantitative magnetic resonance image data is based on the consideration that the at least one material parameter that is present in quantified form in the first quantitative magnetic resonance image data is a function of the basic magnetic field strength that was used in acquiring the quantitative magnetic resonance image data. Thus, for example, for many types of tissue, relaxation time constants such as the T1 relaxation time or the T2 relaxation time are a function of the basic magnetic field strength. For example, in the paper by Bottomley, P. A. et al., "A review of normal tissue hydrogen NMR relaxation times and relaxation mechanisms from 1-100 MHz: Dependence on tissue type, NMR frequency, temperature, species, excision, and age", in Medical Physics 1984, Vol. 11, No. 4, pages 425-448, when the basic magnetic field strength used to measure the T1 relaxation time was increased, an increase was observed in a measured T1 relaxation time. Those skilled in the art will know of other ways in which material parameters are a function of the basic magnetic field strength that is used to measure those parameters.

In this way, conversion of the first quantitative magnetic resonance image data to the second quantitative magnetic resonance image data may be performed such that the first quantitative magnetic resonance image data includes first quantitative data values of the at least one material parameter, and the second quantitative magnetic resonance image data includes second quantitative data values of the at least one material parameter. Here, the first quantitative data values of the material parameter correspond in particular to the data values of the material parameter that are present during measurement using the first basic magnetic field strength. In contrast, in particular the second quantitative data values of the material parameter correspond to the data values of the material parameter that are present during measurement using the second basic magnetic field strength. Thus, the fact that the first quantitative magnetic resonance image data are converted from the first basic magnetic field strength to the second basic magnetic field strength means that the second quantitative magnetic resonance image data are reconstructed as though the second quantitative magnetic resonance image had been acquired using a magnetic resonance scanner that had the second basic magnetic field strength rather than the first basic magnetic field strength.

The first quantitative magnetic resonance image data are converted from the first basic magnetic field strength to the second basic magnetic field strength by execution of a conversion algorithm that has, as its input parameter, the first quantitative magnetic resonance image data, and as its output parameter, the second quantitative magnetic resonance image data. Conversion of the first quantitative magnetic resonance image data to the second quantitative magnetic resonance image data may be performed using additional information, such as a function, that describes the dependence of the at least one material parameter that is quantified in the quantitative magnetic resonance image data on the basic magnetic field strength. The first quantitative magnetic resonance image data may be converted from the first basic magnetic field strength to the second basic magnetic field strength such that the appearance of the image of the second quantitative magnetic resonance image data in the display is as though the second quantitative magnetic resonance image data had been acquired using a magnetic resonance scanner with the second basic magnetic field strength. The first quantitative magnetic resonance image data may be converted pixel-by-pixel or voxel-by-voxel, for each pixel or voxel of the first quantitative magnetic resonance image data, as will be described in more detail below. It is also conceivable for the first quantitative magnetic resonance image data to be converted in each case for relatively large image elements, for example averaged over a number of voxels at the same time, or for segmented anatomical features.

As noted, the converted second quantitative magnetic resonance image data are displayed on a display screen. Thus, it is not the originally acquired quantitative magnetic resonance image data that are displayed, but rather quantitative magnetic resonance image data that are the result of the conversion of the originally acquired magnetic resonance image data. The second quantitative magnetic resonance image data may in this case be regarded as image data that have been generated synthetically from the first quantitative magnetic resonance image data. The first quantitative magnetic resonance image data is not displayed, but may be stored in a database. It is also conceivable for further magnetic resonance image data that is derived from the second quantitative magnetic resonance image data to be displayed on the display screen, in addition to the second quantitative magnetic resonance image data or instead of the second quantitative magnetic resonance image data. As will be described in more detail below, this further magnetic resonance image data may be synthetic qualitative magnetic resonance image data that are calculated from the second quantitative magnetic resonance image data.

A fundamental advantage or an objective of quantitative magnetic resonance imaging is the fact that the quantitative magnetic resonance image data are formed independently of measurement conditions of the magnetic resonance scanner used for the acquisition. Thus, quantification of the at least one material parameter in the quantitative magnetic resonance image data may be independent of parameter settings, adjusting measurements, coil intensities, software versions, etc. In this way, different quantitative magnetic resonance image data that have been acquired using different quantitative magnetic resonance methods, possibly with different measurement conditions, can be compared with one another directly.

In many cases, the quantitative magnetic resonance image data are not absolutely quantitative, but are a function of the basic magnetic field strength that is used for the quantitative magnetic resonance method. One reason for this is that some tissue parameters of the object undergoing investigation, such as the T1 relaxation time, are a function of the strength of the basic magnetic field that is applied. One consequence of this is that image contrast of quantitative magnetic resonance image data may be a function of the basic magnetic field strength that is used to acquire the quantitative magnetic resonance image data. It may thus occur that in the event of a change-over to a different basic magnetic field strength, for example if magnetic resonance scanners are replaced or upgraded, a radiologist must first accustom himself or herself to a new image appearance and/or image contrast of the quantitative magnetic resonance image data when making an assessment. Thus, it may be the case that when there is a change-over from a clinical system to a high-field system, although there is a better yield from the signal-to-noise ratio and/or there are shorter measurement times with the same resolution, the high-field system is nonetheless initially found unsuitable by the radiologist because the image appearance and/or contrast of the quantitative magnetic resonance image data is unfamiliar. This may hinder the assessment of quantitative magnetic resonance image data that are acquired using a magnetic resonance scanner with a field strength unfamiliar to the radiologist. It may also be difficult for the radiologist to compare quantitative magnetic resonance image data sets that have been acquired at different field strengths, for example at the time of follow-up.

By contrast, the procedure according to the invention makes it possible to display the second quantitative magnetic resonance image data that result from converting the first quantitative magnetic resonance image data from the first basic magnetic field strength to the second basic magnetic field strength. In this way, the image appearance and/or contrast of the quantitative magnetic resonance image data from the first basic magnetic field strength may be converted to the second basic magnetic field strength. In this case, the conversion may be performed in the background, so that a radiologist does not notice it during the assessment. Thus, it is possible to acquire quantitative magnetic resonance image data using the magnetic resonance scanner having the first basic magnetic field strength and to display such image data with an image appearance as though the quantitative magnetic resonance image data had been acquired using a magnetic resonance scanner having the second basic magnetic field strength. In this way, with the procedure according to the invention the possibility that the radiologist has to familiarize himself or herself with unfamiliar basic magnetic field strengths when assessing the quantitative magnetic resonance image data can be avoided. The procedure according to the invention can also enable or simplify a direct comparison between quantitative magnetic resonance image data from different days using different magnetic resonance scanners with different basic magnetic field strengths. Thus, follow-up of the object undergoing investigation can be improved.

A user, such as the radiologist making an assessment of the quantitative magnetic resonance image data, may select the second basic magnetic field strength to which the first quantitative magnetic resonance image data are to be converted. For the selection of the second basic magnetic field strength, an operating element may be provided at the user interface, for example a slide control. Conversion of the first quantitative magnetic resonance image data may be performed in dependence on the selection of the second basic magnetic field strength set by the user. In this way, the user can select a desired basic magnetic field strength, for example one that is familiar to the user, for display of the quantitative magnetic resonance image data.

In an embodiment, the conversion of the first quantitative magnetic resonance image data is performed individually for each quantitative voxel value of the first quantitative magnetic resonance image data. In this way, the conversion may be performed at the highest available spatial resolution level of the first quantitative magnetic resonance image data. Here, a "quantitative voxel value" means a quantitative data value that is associated with an individual voxel in the first quantitative magnetic resonance image data. If the first quantitative magnetic resonance image data is composed of two-dimensional magnetic resonance image data, the quantitative voxel value will be a quantitative pixel value.

In another embodiment, the first basic magnetic field strength is larger than the second basic magnetic field strength. Thus, the magnetic resonance scanner that is used to acquire the first quantitative magnetic resonance image data may be a high-field system of more than 3 tesla, for example 7 tesla or 9.4 tesla or more than 10 tesla. The second basic magnetic field strength may then be a clinical basic magnetic field strength 1.5 tesla or 3 tesla. As an alternative, the reverse case is also conceivable, namely that the first basic magnetic field strength is smaller than the second basic magnetic field strength. In that case, the magnetic resonance scanner that is used to acquire the first quantitative magnetic resonance image data is a low-field system. The first basic magnetic field strength will then be less than 1.5 tesla, for example 0.5 tesla or 1 tesla. The second basic magnetic field strength is then a clinical basic magnetic field strength of 1.5 tesla or 3 tesla. As an alternative, it is also possible for a conversion to be performed between the two clinical basic magnetic field strengths, for example of 1.5 tesla to 3 tesla or from 3 tesla to 1.5 tesla.

In an embodiment, the first basic magnetic field strength is 7 tesla and the second basic magnetic field strength is 1.5 tesla or 3 tesla. This embodiment makes it possible to convert the quantitative magnetic resonance image data from the most commonly used basic magnetic field strength in the high-field range to the most commonly used basic magnetic field strength in the clinical range.

In another embodiment, the conversion of the first quantitative magnetic resonance image data is performed by use of a function that describes a dependence of the quantitative data values on the basic magnetic field strength. The function may include function parameters by which the conversion of the first quantitative magnetic resonance image data to the second quantitative magnetic resonance image data is made. The function parameters may be selected on the basis of a dependence, known to those skilled in the art, of the quantitative data values on the basic magnetic field strength. For example, it is known from the publication of Bottomley et al. cited above that a T1 relaxation time is a function of the basic magnetic field strength as follows:

$$T_1 = A\nu^B$$

Here, T1 is the T1 relaxation time and $\nu$ is the operating frequency of the magnetic resonance scanner (Larmor frequency), which is the product of the basic magnetic field strength and the gyromagnetic ratio (42.6 MHz/T). A and B are fit parameters, wherein, according to the publication by Bottomley (Table 12), for example for A, a fit parameter range for different tissues of 0.000455 to 0.0113 and for B a fit parameter range of 0.1743 to 0.4203 have been determined. This known dependence may be applied as a function for converting the first quantitative magnetic resonance image data, for example. For a simplified non-linear dependence, an exponent of ⅓ may be applied for converting the T1 relaxation time between different basic magnetic field strengths. A different non-linear function may also be adopted. It is also conceivable for a linear function to be used for converting the quantitative data values. One example, in the specific case for the conversion of the T1 relaxation time from 7 tesla to 3 tesla, is for a simple linear function to be assumed, so the T1 relaxation time is divided by 2.3. Those skilled in the art know of other dependences of material parameters on the basic magnetic field strength, and these may be implemented, depending on the application case, as a function for converting the first quantitative magnetic resonance image data. The use of a function provides a particularly simple and robust way to convert the first quantitative magnetic resonance image data.

In another embodiment, the first quantitative magnetic resonance image data are segmented into a number of material classes, and the first quantitative magnetic resonance image data are converted using the segmentation of the first quantitative magnetic resonance image data. The segmentation may assign one material class of the multiple material classes to each voxel in the first quantitative magnetic resonance image data on the basis of the at least one material parameter quantified for this voxel. The material classes may include classes of tissue such as cerebral grey matter, cerebral white matter, fatty tissue, water-bearing tissue, osseous tissue, muscle tissue, the tissue of a particular organ. Other classes of materials deemed useful by those skilled in the art are also conceivable. In this case, the segmentation may be performed by execution of a segmentation algorithm known to those skilled in the art. It is also conceivable for a magnetic resonance fingerprinting method, which is described in more detail below, to be used for segmentation of the first quantitative magnetic resonance image data. The segmentation of the first quantitative magnetic resonance image data may provide valuable additional information for converting the first quantitative magnetic resonance image data from the first basic magnetic field strength to the second basic magnetic field strength.

In another embodiment, for the number of material classes, a respective quantitative data value with the second basic magnetic field strength is stored in a database, and the first quantitative magnetic resonance image data are converted on the basis of the quantitative data values stored in the database. It is then possible for a voxel of the quantitative data value that has been stored in the database for the material class assigned to the voxel in the segmentation to be set, for converting the first quantitative magnetic resonance image data. For the purpose of conversion of the first quantitative magnetic resonance image data, the quantitative data value may be retrieved from the database. It is also conceivable to use an extended database that has the quantitative data values of the material parameters at different basic magnetic field strengths. This procedure makes it possible to convert the first quantitative magnetic resonance image data in a manner matched to the number of material classes particularly advantageously.

In a further embodiment, acquisition of the first quantitative magnetic resonance image data to includes acquisition of the first quantitative magnetic resonance image data by execution of a magnetic resonance fingerprinting method.

A magnetic resonance fingerprinting method is known, for example, from the publication by Ma et al., "Magnetic Resonance Fingerprinting", in Nature, 14 Mar. 2013, Vol. 495, No. 7440, pages 187-192. In a magnetic resonance fingerprinting method, acquire parameters are typically varied during the magnetic resonance acquisition in a pseudo-randomized way. Possible acquire parameters that are varied during acquisition are for example echo time, the form and/or number of radio-frequency pulses, the form and/or number of gradient pulses, diffusion coding, etc. During this magnetic resonance acquisition, a magnetic resonance signal characteristic is then usually generated. The magnetic resonance signal characteristic thus indicates, in particular, a change in acquired magnetic resonance signal values over the acquisition period of the magnetic resonance signal characteristic.

This magnetic resonance signal characteristic is then typically compared with a number of database signal characteristics that are stored in a magnetic resonance fingerprinting database, in a signal comparison. During this procedure, a different data value of at least one material parameter is assigned to each of the different database signal characteristics. For acquiring the first quantitative magnetic resonance image data, the data values of the at least one material parameter are stored in the magnetic resonance fingerprinting database for the first basic magnetic field strength. In that case, the respective database signal characteristic represents the signal characteristic to be expected in the magnetic resonance fingerprinting method when a sample under investigation has material properties that correspond to those of the associated data value of the at least one material parameter. The database signal characteristics may be determined, for example, in a calibrating measurement, and/or simulated. The database signal characteristics are matched to the first basic magnetic field strength, which means that, during the simulation of the database signal characteristics, a magnetic resonance scanner with the first basic magnetic field strength is used as a simulation parameter.

The magnetic resonance fingerprinting method then typically provides for one of the number of database signal characteristics to be assigned to the generated magnetic resonance signal characteristic on the basis of the result of the signal comparison. The date value of the at least one material parameter that is associated with the assigned database signal characteristic can then be applied as a measured value of the at least one material parameter. Particularly advantageously in this case, using the magnetic resonance fingerprinting method it is possible to quantify a number of different material parameters at the same time. In this way, the magnetic resonance fingerprinting method is particularly suitable for acquiring the first quantitative magnetic resonance image data.

In another embodiment, the database in which the quantitative data value with the second basic magnetic field strength is stored, is the magnetic resonance fingerprinting database that is used for the magnetic resonance fingerprinting method. The segmentation of the first quantitative magnetic resonance image data may be carried out directly by the magnetic resonance fingerprinting method. Thus, it is possible for database signal characteristics, which are stored with respect to the various material classes, to be stored in the magnetic resonance fingerprinting database. It is then possible for the magnetic resonance fingerprinting database to be used at the same time for segmentation of the first quantitative magnetic resonance image data and for conversion of the first quantitative magnetic resonance image data. In this way, particularly effective data management can be performed. As will be described in more detail below, the data values of the at least one material parameter are stored in the magnetic resonance fingerprinting database with different basic magnetic field strengths.

In another embodiment, data values of at least one material parameter with the first basic magnetic field strength and with the second basic magnetic field strength are stored in the magnetic resonance fingerprinting database that is used for the magnetic resonance fingerprinting method, wherein the first quantitative magnetic resonance image data is converted on the basis of the stored data values of the at least one material parameter. In this way, the data values of the at least one material parameter with the first basic magnetic field strength can be used for acquiring the first quantitative magnetic resonance image data with the magnetic resonance fingerprinting method. Then, the data values of the at least one material parameter with the second basic magnetic field strength can be used for the conversion of the first quantitative magnetic resonance image data.

In another embodiment, synthetic qualitative magnetic resonance image data that has a contrast that applies at the second basic magnetic field strength are determined on the basis of the second quantitative magnetic resonance image data, and the synthetic qualitative magnetic resonance image data are displayed on the display screen. The synthetic qualitative magnetic resonance image data may be calculated from the second quantitative magnetic resonance image data on the basis of a simulation method, for example using the Bloch equations. Methods for calculating qualitative images of different image contrast from the quantitative image data in this context are known to those skilled in the art, so further details are not necessary herein. The synthetic qualitative magnetic resonance image data may then have an appearance and/or contrast of the image as though it had been acquired by a magnetic resonance scanner having the second basic magnetic field strength.

In another embodiment, the first quantitative magnetic resonance image data are converted using a system configuration parameter that takes account of different system properties of the magnetic resonance scanner with the first basic magnetic field strength and the second basic magnetic field strength. In this way, the system configuration parameter is included as a further input parameter in the conversion of the first quantitative magnetic resonance image data. According to a further embodiment, in this context the system configuration parameter may describe a dependence of at least one of the following system properties on the basic magnetic field strength that is used: eddy current behavior, B0 inhomogeneity, B1 inhomogeneity, the occurrence of image artifacts. The system configuration parameter may in this way represent valuable additional information when converting the first quantitative magnetic resonance image data. By taking into account the system configuration parameter, it is possible, for example, for the appearance of an image, particularly with respect to the occurrence of image artifacts, of the converted first quantitative magnetic resonance image data to be adapted to the second basic magnetic field strength.

In another embodiment, the acquisition of the first quantitative magnetic resonance image data includes acquisition of the first quantitative magnetic resonance image data, and acquisition of third quantitative magnetic resonance image data of the object undergoing investigation performed by a further magnetic resonance scanner at least one day before the first quantitative magnetic resonance image data are acquired, The further magnetic resonance scanner has the second basic magnetic field strength, and the second quantitative magnetic resonance image data are displayed on the display screen together with the third quantitative magnetic resonance image data. A comparison is made between the second quantitative magnetic resonance image data and the third quantitative magnetic resonance image data. Thus, the first quantitative magnetic resonance image data and the third quantitative magnetic resonance image data are acquired from the same object undergoing investigation. In this way, it is particularly simple to perform a follow-up as to a condition of the object undergoing investigation, even if the first quantitative magnetic resonance image data and third quantitative magnetic resonance image data are acquired by different magnetic resonance scanners having different basic magnetic field strengths.

The processor according to the invention includes an acquisition unit, a conversion unit and an output unit, with the processor being configured to implement the method according to the invention.

The processor thus is programmed for carrying out a method for displaying quantitative magnetic resonance image data of an object undergoing investigation. The acquisition unit is designed to receive or acquire first quantitative magnetic resonance image data of the object undergoing investigation using a magnetic resonance scanner, wherein the magnetic resonance scanner has a first basic magnetic field strength. The conversion unit is designed to convert the first quantitative magnetic resonance image data from the first basic magnetic field strength to a second basic magnetic field strength, with second quantitative magnetic resonance image data thereby being generated. The output unit is designed to display the second quantitative magnetic resonance image data.

The components of the processor, namely the acquisition unit, the conversion unit and the output unit, may be constructed predominantly in the form of software components. These components may also in part be software-assisted hardware components such as FPGAs or similar, particularly when rapid calculations are required. Similarly, the interfaces needed, for example if only the transfer of data from other software components is required, may be constructed as software interfaces. However, they may also be constructed as hardware interfaces that are controlled by suitable software. It is also conceivable for a number of these components to be grouped together into an individual software component or software-assisted hardware component.

The magnetic resonance apparatus according to the invention includes the processor according to the invention, and a scanner.

The processor is designed to transmit control signals to the magnetic resonance scanner and/or to receive and/or process control signals in order to carry out the method according to the invention. The processor may be integrated into the magnetic resonance apparatus. The processor may also be installed separately from the magnetic resonance apparatus. The processor may be connected to the magnetic resonance apparatus.

The provision of the first quantitative magnetic resonance image data to the processor may be acquisition of the first quantitative magnetic resonance image data by operation of the scanner of the magnetic resonance apparatus. The acquisition may alternatively be reception of first quantitative image data by the acquisition unit from a database. The first quantitative magnetic resonance image data may then be transferred to the processor for further processing. The first quantitative magnetic resonance image data can then be acquired by the processor by the acquisition unit.

The non-transitory, computer-readable data storage medium according to the invention can be loaded directly to a memory of a programmable processor and has program code that cause the method according to the invention to be performed when the program code is executed. As a result, the method according to the invention can be performed quickly, identically reproducibly and robustly. The processor must satisfy certain preconditions, such as an appropriate RAM, an appropriate graphics card or an appropriate logic unit so that the respective method steps can be performed efficiently. Examples of electronically readable data media are a DVD, a magnetic tape, a hard disk or a USB stick on which electronically readable control information, in particular software is stored.

The advantages of the processor according to the invention, the magnetic resonance apparatus according to the invention and the storage medium according to the invention correspond substantially to the advantages of the method according to the invention that were described in detail above. Features, advantages or alternative embodiments mentioned above are applicable to the other aspects of the invention. The functional features of the method take the form of appropriate device modules, in particular hardware modules.

BRIEF DESCRIPTION OF THE DRAWINGS

FIG. 3 is a flowchart of a second embodiment of a method according to the invention.

DESCRIPTION OF THE PREFERRED EMBODIMENTS

Figure 1:
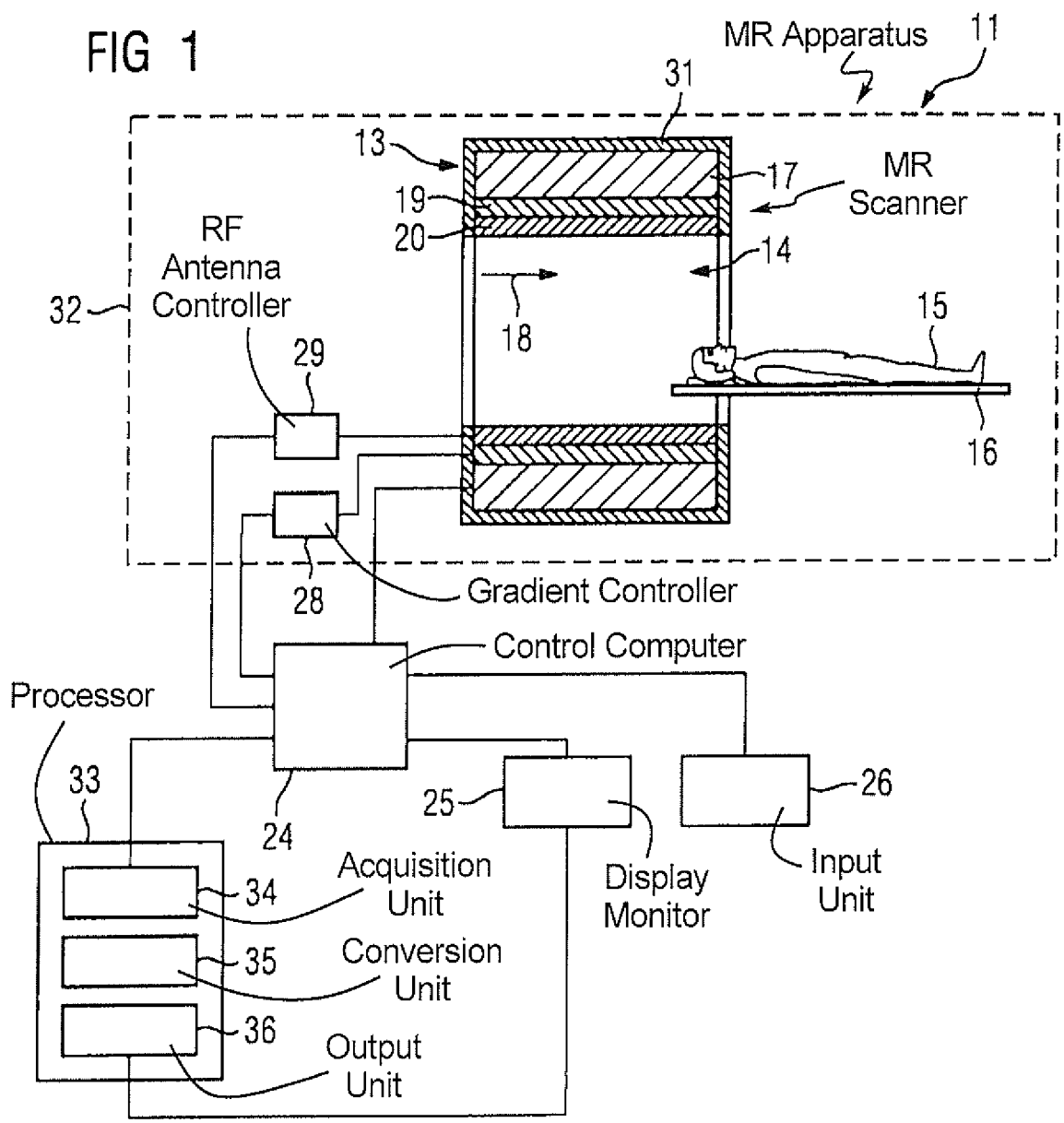
FIG. 1 shows a magnetic resonance apparatus according to the invention having a processor according to the invention, in a schematic illustration.

FIG. 1 schematically shows a magnetic resonance apparatus 11 according to the invention having a processor 33 according to the invention. The magnetic resonance apparatus 11 includes magnetic resonance data acquisition scanner 13, having a basic field magnet 17 for the generation of a strong and constant basic magnetic field 18 of a first basic magnetic field strength, which is, for example, seven tesla. The magnetic resonance scanner 13 has a cylindrical patient-receiving area 14 for receiving an object 15 undergoing investigation, in the present case a patient. The patient-receiving area 14 is cylindrically enclosed in a peripheral direction by the scanner 13. The patient 15 can be moved into the patient-receiving area 14 by a patient support 16. For this purpose, the patient support 16 has a table to lie on, which is movable within the scanner 13. The scanner 13 is screened to the outside by a housing 31.

The scanner 13 further has a gradient coil arrangement 19 for the generation of magnetic field gradients that are used for spatial coding of magnetic resonance signals during imaging. The gradient coil arrangement 19 is controlled by a gradient controller 28. Furthermore, the scanner 13 has a radio-frequency antenna unit 20, which in the case shown is in the form of a body coil that is integrated in fixed manner in the scanner 13. The radio-frequency antenna unit 20 is controlled by the radio-frequency antenna controller 29 to radiate radio-frequency magnetic resonance sequences into an examination volume that is formed substantially by the patient-receiving area 14. As is known, the radiated radio-frequency sequences excite certain nuclear spins in the patient 15, so as to give those excited nuclear spins a magnetization that causes those nuclear spins to deviate, by an amount known as a flip angle, from the polarization produced by the basic magnetic field 18. As those excited nuclear spins relax, so as to return to their steady state position, they emit radio-frequency signals (magnetic resonance signals). The radio-frequency antenna unit 20 is furthermore constructed for receiving magnetic resonance signals, in particular from the patient 15.

For control of the basic field magnet 17, the gradient controller 28 and the radio-frequency antenna controller 29, the magnetic resonance apparatus 11 has a control computer 24. The control computer 24 exercises central control over the magnetic resonance apparatus 11, for example performing a predetermined imaging gradient echo sequence. Control information, such as imaging parameters, and reconstructed magnetic resonance images can be provided to a user on a display monitor 25. Moreover, the magnetic resonance apparatus 11 has an input unit 26 via which information and/or parameters can be entered by a user during a measuring procedure. The control computer 24 may include the gradient controller 28 and/or the radio-frequency antenna controller 29 and/or the display monitor 25 and/or the input unit 26.

The illustrated magnetic resonance apparatus 11 may include further components that magnetic resonance apparatuses conventionally have. The general functioning of a magnetic resonance apparatus is known to those skilled in the art, so a detailed description of such operation is not necessary herein.

Thus, in the case shown the processor 33 includes an acquisition unit 34, a conversion unit 35 and an output unit 36.

Thus, the magnetic resonance apparatus 11 is constructed together with the processor 33 for performing a method according to the invention. The acquisition unit 34 of the processor 33 then performs the acquisition of the first quantitative image data from the control computer 24 of the magnetic resonance apparatus 11. For this purpose, the acquisition unit 34 is connected to the control computer 24 for data exchange. The second quantitative magnetic resonance image data can then be transferred from the output unit 36 of the processor 33 to the display monitor 25.

As an alternative to the shown example, the processor 33 may also be constructed for performing the method according to the invention by itself. For this purpose, the acquisition unit 34 will typically load the first quantitative image data from a database, and/or retrieve it from the magnetic resonance apparatus 11.

Figure 2:
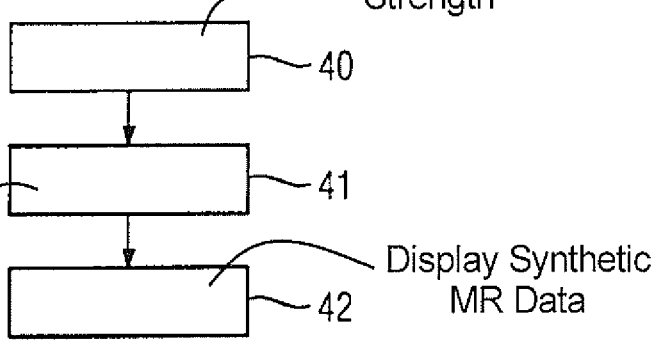
FIG. 2 is a flowchart of a first embodiment of THE method according to the invention.

FIG. 2 shows a flowchart of a first embodiment of the method according to the invention for displaying quantitative magnetic resonance image data of the object 15 undergoing investigation.

In a first method step 40, first quantitative magnetic resonance image data of the object undergoing investigation 15 is acquired by the acquisition unit 34. The first quantitative magnetic resonance image data are or have been acquired by a magnetic resonance scanner 13 that has a first basic magnetic field strength.

In a method step 41, the first quantitative magnetic resonance image data is converted from the first basic magnetic field strength to a second basic magnetic field strength by means of the conversion unit 35, whereby second quantitative magnetic resonance image data are generated.

In a further method step 42, the second quantitative magnetic resonance image data are displayed on a display screen by the output unit 36.

FIG. 3 is a flowchart of a second embodiment of the method according to the invention for displaying quantitative magnetic resonance image data of the object 15 undergoing investigation.

The description below is limited substantially to the differences from the exemplary embodiment in FIG. 2, the reader being referred to the description of the exemplary embodiment in FIG. 2 for those method steps which remain the same. Method steps which remain substantially the same are always numbered using the same reference numerals.

The embodiment of the method according to the invention that is shown in FIG. 3 substantially includes the method steps 40, 41, 42 of the first embodiment of the method according to the invention according to FIG. 2. In addition, the embodiment of the method according to the invention that is shown in FIG. 3 includes additional method steps and sub-steps. A method sequence that is an alternative to FIG. 3 and which has only some of the additional method steps and/or sub-steps illustrated in FIG. 3 is also conceivable. A method sequence that is an alternative to FIG. 3 may also have additional method steps and/or sub-steps.

Conversion of the first quantitative magnetic resonance image data in the further method step 41 is in this case performed in particular individually for each quantitative voxel value of the first quantitative magnetic resonance image data. Further, the first quantitative magnetic resonance image data is in particular converted from the first basic magnetic field strength to the second basic magnetic field strength, wherein the first basic magnetic field strength is larger than the second basic magnetic field strength. For example, the first basic magnetic field strength is 7 tesla and the second basic magnetic field strength is 1.5 tesla or 3 tesla. The reverse case is also conceivable, in which the first basic magnetic field strength is smaller than the second basic magnetic field strength.

For the conversion, two procedures are in principle conceivable, and these are described in the sub-step 41-1 and the sub-step 41-2 of the further method step 41. Both procedures may in principle be used separately from one another, but may also be used in combination with one another.

According to the first procedure for converting the first quantitative magnetic resonance image data, in the sub-step 41-1 of the further method step 41 the first quantitative magnetic resonance image data are segmented into a number of material classes, wherein the first quantitative magnetic resonance image data are converted using the segmentation of the first quantitative magnetic resonance image data. For this purpose, in a further method step 43, for the number of material classes a respective quantitative data value with the second basic magnetic field strength can be retrieved from a database, wherein the first quantitative magnetic resonance image data is converted in the sub-step 41-1 of the further method step 41 on the basis of the quantitative data values stored in the database.

These methods can be extended such that, in a sub-step 40-1 of the first method step 40, acquisition of the first quantitative magnetic resonance image data includes acquire of the first quantitative magnetic resonance image data by a magnetic resonance fingerprinting (MRF) method. In that case, the database from which the quantitative data value with the second basic magnetic field strength is retrieved in the further method step 43 can be the magnetic resonance fingerprinting database used for the magnetic resonance fingerprinting method. It is also conceivable, as an alternative or in addition, for data values of at least one material parameter with the first basic magnetic field strength and with the second basic magnetic field strength to be stored in the magnetic resonance fingerprinting database used for the magnetic resonance fingerprinting method, wherein the first quantitative magnetic resonance image data are converted on the basis of the stored data values of the at least one material parameter.

According to the second procedure for converting the first quantitative magnetic resonance image data, in the sub-step 41-2 of the further method step 41 the first quantitative magnetic resonance image data is converted by means of a function that describes a dependence of the quantitative data values on the basic magnetic field strength.

It is furthermore conceivable, in a further method step 44, for a system configuration parameter to be retrieved that takes account of different system properties of the magnetic resonance scanner with the first basic magnetic field strength and the second basic magnetic field strength. It is then possible for the first quantitative magnetic resonance image data to be converted in the further method step 41 on the basis of the system configuration parameter. Here, the system configuration parameter can describe a dependence of at least one of the following system properties on the basic magnetic field strength that is used: eddy current behavior, B0 inhomogeneity, B1 inhomogeneity, the occurrence of image artifacts.

Furthermore conceivable is a procedure in which, on the basis of the second quantitative magnetic resonance image data, in a further method step 45 synthetic qualitative magnetic resonance image data of a contrast that applies at the second basic magnetic field strength. The synthetic qualitative magnetic resonance image data can then be displayed on the display monitor 25 in the further method step 42, in addition to the second quantitative magnetic resonance image data or instead of the second quantitative magnetic resonance image data.

Finally, an embodiment is conceivable in which acquisition of the first quantitative magnetic resonance image data includes acquisition of the first quantitative magnetic resonance image data and, in a further method step 46, acquisition of third quantitative magnetic resonance image data of the object is undergoing investigation is performed by a further magnetic resonance scanner at least one day before the first quantitative magnetic resonance image data are acquired, wherein the further magnetic resonance scanner has the second basic magnetic field strength. Then, in the further method step 42, the second quantitative magnetic resonance image data can be displayed on the display monitor 25 together with the third quantitative magnetic resonance image data. Thus, a comparison can be made between the second quantitative magnetic resonance image data and the third quantitative magnetic resonance image data.

The method steps of the method according to the invention that are illustrated in FIGS. 2 and 3 are carried out by the processor. For this purpose, the processor includes necessary software and/or computer programs that are stored in a memory unit of the processor. The software and/or computer programs include program code that are constructed to carry out the method according to the invention when the computer program and/or the software in the processor is executed by the processor.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for displaying quantitative magnetic resonance (MR) image data of an examination object, comprising:
   providing a processor with first quantitative MR image data of an examination object, said first quantitative MR image data having been produced by an MR scanner using a first basic magnetic field strength;
   in said processor, executing an algorithm that acts on the first quantitative MR image data in order to convert said first quantitative MR image data into synthetic second quantitative MR image data as would be acquired by said MR scanner using a second basic magnetic field strength that differs from said first basic magnetic field strength; and
   displaying the second quantitative MR image data at a display screen.

2. A method as claimed in claim 1 wherein said first quantitative MR image data are composed of a plurality of image elements, selected from the group consisting of pixels and voxels, and converting said first quantitative MR image data individually for each image element thereof.

3. A method as claimed in claim 1 wherein said first basic magnetic field strength is larger than said second basic magnetic field strength.

4. A method as claimed in claim 3 wherein said first basic magnetic field strength is 7 tesla, and said second basic magnetic field strength is 1.5 tesla or 3 tesla.

5. A method as claimed in claim 1 comprising converting said first quantitative MR image data using a function that describes a dependence of quantitative data values of the first quantitative magnetic resonance image on the basic magnetic field strength.

6. A method as claimed in claim 1 comprising, in said processor, segmenting said first quantitative MR image data into a plurality of material classes, and converting the first quantitative MR image data dependent on the segmentation thereof.

7. A method as claimed in claim 6 comprising, for the plurality of material classes, storing a respective quantitative data value with the second basic magnetic field strength in a database accessible by said processor, and converting said first quantitative MR image data dependent on the quantitative data values accessed from said database.

8. A method as claimed in claim 1 comprising acquiring said first quantitative MR image data by execution of an MR fingerprinting method with said MR scanner.

9. A method as claimed in claim 8 comprising, for the plurality of material classes, storing a respective quantitative data value with the second basic magnetic field strength in an MR fingerprinting database accessible by said processor, and converting said first quantitative MR image data dependent on the quantitative data values accessed from said MR fingerprinting database.

10. A method as claimed in claim 9 comprising storing data values of at least one material parameter with the first basic magnetic field strength and with the second basic magnetic field strength in said MR fingerprinting database, and converting the first quantitative MR image data based on the stored at least one material parameter.

11. A method as claimed in claim 1 comprising, in said processor, using the second quantitative MR image data to produce, as said synthetic second qualitative MR image data, MR data that have a contrast that applies at said second basic magnetic field strength.

12. A method as claimed in claim 1 comprising converting said first quantitative MR image data using a system configuration parameter that accounts for different system properties of said MR scanner with said first basic magnetic field strength and said second basic magnetic field strength.

13. A method as claimed in claim 12 wherein said system configuration parameter describes a dependence of at least one item on said basic magnetic field strength, said item being selected from the group consisting of eddy current behavior, and inhomogeneity of the basic magnetic field, and inhomogeneity of a radio-frequency field used to acquire the first quantitative MR image data, and an occurrence of image artifacts in said first quantitative MR image data.

14. A method as claimed in claim 1 wherein providing said processor with said first quantitative MR image data comprises operating said MR scanner from said processor in order to acquire said first quantitative MR image data, and wherein said method comprises operating a further MR scanner from said processor to acquire third quantitative MR image data at least day before acquiring said first quantitative MR image data, said further MR scanner having said second basic magnetic field strength, and comprising displaying the synthetic second quantitative MR image data at said display screen together with said third quantitative MR image data in a format allowing a comparison to be made between said synthetic second quantitative MR image data and said third quantitative MR image data.

15. A computer for displaying quantitative magnetic resonance (MR) image data of an examination object, comprising:

a processor configured to receive first quantitative MR image data of an examination object, said first quantitative MR image data having been produced by an MR scanner using a first basic magnetic field strength;

said processor being configured to execute an algorithm that acts on the first quantitative MR image data in order to convert said first quantitative MR image data into synthetic second quantitative MR image data as would be acquired by said MR scanner using a second basic magnetic field strength that differs from said first basic magnetic field strength; and a display monitor comprising a display screen at which said processor is configured to display the synthetic second quantitative MR image data.

16. A magnetic resonance (MR) apparatus comprising:

an MR data acquisition scanner;

a processor provided with first quantitative MR image data of an examination object, said first quantitative magnetic resonance image data having been produced by said MR scanner using a first basic magnetic field strength;

said processor being configured to execute an algorithm that acts on the first quantitative MR image data in order to convert said first quantitative MR image data into synthetic second quantitative MR image data as would be acquired by said MR scanner using a second basic magnetic field strength that differs from said first basic magnetic field strength; and a display monitor comprising a display screen at which said processor is configured to display the synthetic second quantitative MR image data.

17. A non-transitory, computer-readable data storage medium encoded with programming instructions, said storage medium being loaded into a control computer of a magnetic resonance (MR) apparatus that comprises an MR data acquisition scanner, said programming instructions causing said control computer to:

receive first quantitative MR image data of an examination object, said first quantitative MR image data having been produced by the MR data acquisition scanner using a first basic magnetic field strength;

execute an algorithm that acts on the first quantitative MR image data in order to convert said first quantitative MR image data into synthetic second quantitative MR image data as would be acquired by said MR scanner using a second basic magnetic field strength that differs from said first basic magnetic field strength; and display the synthetic second quantitative MR image data at a display screen.

* * * * *